(12) United States Patent
Rouleau

(10) Patent No.: US 11,512,674 B2
(45) Date of Patent: Nov. 29, 2022

(54) PROGRAMMABLE NON-CONTACT SWITCH AND METHOD OF EMULATING HIGH-RELIABILITY SWITCH

(71) Applicant: STEERING SOLUTIONS IP HOLDING CORPORATION, Saginaw, MI (US)

(72) Inventor: James E. Rouleau, Burt, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 182 days.

(21) Appl. No.: 16/750,313

(22) Filed: Jan. 23, 2020

(65) Prior Publication Data
US 2021/0231089 A1 Jul. 29, 2021

(51) Int. Cl.
*F02N 11/08* (2006.01)
*F02N 11/10* (2006.01)
*H03K 17/081* (2006.01)

(52) U.S. Cl.
CPC .......... *F02N 11/087* (2013.01); *F02N 11/101* (2013.01); *H03K 17/08116* (2013.01); *F02N 2011/0874* (2013.01)

(58) Field of Classification Search
CPC ................ F02N 11/087; F02N 11/101; F02N 2011/0874; H03K 17/08116; H03K 2217/94021; H03K 2217/96066; H03K 2217/94015; H03K 17/97; H03K 17/975; H03K 17/965
See application file for complete search history.

(56) References Cited

U.S. PATENT DOCUMENTS

| | | | | |
|---|---|---|---|---|
| 5,508,655 A * | 4/1996 | Cederlind | ............ | H03K 17/687 236/46 R |
| 8,334,688 B2 * | 12/2012 | Quinn | ................... | G01D 5/145 324/207.2 |
| 2012/0053886 A1 * | 3/2012 | Poeltl | .................. | H01H 1/0015 702/149 |
| 2013/0057065 A1 * | 3/2013 | Rinze | .................... | F02N 11/101 307/10.6 |
| 2015/0015063 A1 * | 1/2015 | Bissontz | ............... | B60L 3/0069 307/9.1 |
| 2018/0231400 A1 * | 8/2018 | Okumura | ............. | G01D 5/2454 |
| 2020/0103022 A1 * | 4/2020 | Mendoza-Vega | ....... | F16H 61/24 |

* cited by examiner

*Primary Examiner* — Scott A Reinbold

(74) *Attorney, Agent, or Firm* — Dickinson Wright PLLC

(57) ABSTRACT

A programmable or configurable non-contact solid state switch device and method are provided for emulating a high reliability switch. The switch device senses position information related to a switch and is calibrated using a learning operation to learn position information of mechanical features of the switch and to map the positions of these features. Electrical outputs or functions are assigned to the mapped positions and stored such that the switch device generates the outputs when their corresponding positions are sensed. A switch device is uniquely configured to the mechanical system in which it operates.

19 Claims, 9 Drawing Sheets

PROGRAMMABLE NON-CONTACT SWITCH AND METHOD OF EMULATING HIGH-RELIABILITY SWITCH

BACKGROUND

The present application generally relates to a programmable non-contact switch, and more particularly to a method of emulating a high-reliability switch that can be especially useful in safety-critical controls Traditionally, electrical switches are electromechanical devices that use mechanical motion to change the flow of electrical current. Conventional switch technology employs mechanical contacts to control electrical circuits. For example, a conventional switch utilizes moving and stationary parts to "make" and "break" circuits as the switch is actuated. These switches work reasonably well in many applications but have a finite life due to mechanical wear and degradation from current flow through the conductive elements (e.g., arcing and tracking).

Another downside of conventional electrical switches is that the relationship between the mechanical motion and the electrical status (on/off) is a function of multiple dimensional tolerances. For example, mechanical tolerances can create varying operational timing due to part to part variation. Contacts change over time due to wear and environment, creating varying operational timing related to age and frequency of usage of the switch. These variations in operational timing yield an operating curve which is best described by the probability of a switch from the population of all switches to be asserted during the mechanical travel, as shown in FIG. 1.

This variation in performance can be challenging in safety-critical controls such as automotive ignition switches. For example, with reference to FIG. 2, an automotive discrete logic ignition switch can have different operations modes such as OFF, ACC(ESSORY), RUN, and START defined in connection with different positions of detents, spring-returned (momentary) functions and/or interlocks, and different modes of power and/or power-assist operations are provided in these modes. The RUN and START modes may provide a vehicle operator with power-assisted steering and braking that is not available in other modes such as the ACCESSORY mode. Each bar representing an operation mode has tolerances built into the ends thereof (e.g., see areas defined in circles in FIG. 2) that create uncertainty. If the ignition switch were to be subject to sufficient wear and timing variation that the RUN mode desired by the user is improperly characterized by electronic controls as an ACCESSORY mode, the user could be having to operate the vehicle without power-steering or power-assisted brakes.

Thus, in the case of ignition switches, the electrical contact functions must be reliably synchronized with mechanical features such as detents, spring-returned (momentary) functions, and interlocks and not overlap undesirably. Issues such as mechanical and electrical stack compromises can arise when mechanical features and electrical output signals defined for a switch are not synchronized and overlap (e.g., when the intended mechanical feature cannot be resolved during switch operation and an incorrect electrical response is generated). Efforts to reduce such undesirable operational variations can be expensive and may not be completely effective. For example, traditional switches were often adjusted to synchronize one function, but could not optimally synchronize all positions.

SUMMARY

In accordance with example embodiments a device for emulating a switch is provided that comprises a sensor configured to sense position information for one or more features of the switch along a range of mechanical travel associated with operating the switch; and a controller configured to store in a memory device the position information and a corresponding output for each of the one or more features, and to generate the corresponding output when the sensor detects the position information for that output during operation of the switch.

In accordance with aspects of example embodiments, the position information is generated by the sensor during a learning operation during which the switch is moved to each feature among the one or more features along the range of mechanical travel, and the sensor generates position information for that feature, and the position information is stored by the controller with a corresponding output designated for that feature.

In accordance with aspects of example embodiments, the switch has at least one action chosen from a rotary action and a linear action, and the range of mechanical travel is about an axis of rotation for the rotary action and along a longitudinal axis for the linear action.

In accordance with aspects of example embodiments, one or more features of the switch are chosen from a detent position, an interlock engagement position, a position corresponding to a beginning of a momentary switch operation zone, and an end of travel position.

In accordance with aspects of example embodiments, the sensor is a non-contact solid state sensor. Also, the sensor can be selected from the group consisting of a Hall effect sensor, a magneto reluctance sensor, and capacitance sensor. For example, the sensor can comprise two angle position on-axis Hall effect elements configured to detect the rotation of a pair of two pole magnets rotated in unison but at differing rates of rotation to generate sinusoidal phase difference between the two magnets to sense the position information of the switch.

In accordance with aspects of example embodiments, the device further comprises a second sensor to sense the position information for the one or more features of the switch to provide redundant position information to the controller.

In accordance with aspects of example embodiments, the switch is selected from the group consisting of an automotive ignition switch, an automotive windshield wiper switch, an automotive turn signal switch, an automotive headlamp switch, an automotive transmission control switch, and an air bag deployment operation switch.

In accordance with aspects of example embodiments, the output is selected from the group consisting of a discrete logic output, and a signal communicated over a communication media, a Controller Area Network (CAN) bus signal, a device message, and a switch contact operation command. For example, the communication media can be selected from the group consisting of a radio frequency link, a wired link, a serial bus link, and an optical link.

In accordance with an example embodiment, a method of emulating a high reliability switch is provided that comprises: deploying a sensing device with respect to a switch to generate position information related to the switch, the sensing device being configured to sense position information for one or more features of the switch along a range of mechanical travel associated with operating the switch; mapping the position information corresponding to the one or more features of the switch to generate a learned profile of the switch; and defining an output for respective ones of the one or more features of the switch and storing the output and the corresponding position information for the respective ones of the one or more features of the switch.

In accordance with aspects of example embodiments, the method further comprises defining a range of position information values with respect to the corresponding position information for the respective ones of the one or more features of the switch. Also, the method further comprises operating the switch and, when position information is sensed that is in the range of position values defined for a respective one of the one or more features of the switch, generating the stored output that corresponds to the sensed position information during operation of the switch.

In accordance with aspects of example embodiments, the mapping comprises obtaining position information for one or more features of the switch chosen from a detent position, an interlock engagement position, a position corresponding to a beginning of a momentary switch operation zone, and an end of travel position.

In accordance with aspects of example embodiments, deploying the sensing device comprises using a non-contact solid state sensor to sense the switch. The non-contact solid state sensor can be selected from the group consisting of a Hall effect sensor, a magneto reluctance sensor, and capacitance sensor. For example, the sensing device can be a Hall effect sensor comprising two angle position on-axis Hall effect elements configured to detect the rotation of a pair of two pole magnets rotated in unison but at differing rates of rotation to generate sinusoidal phase difference between the two magnets to sense the position information of the switch. Also, the switch can be selected from the group consisting of an automotive ignition switch, an automotive windshield wiper switch, an automotive turn signal switch, an automotive headlamp switch, an automotive transmission control switch, and an air bag deployment operation switch.

In accordance with aspects of example embodiments, defining the output comprises designating an output with respect to position information that is selected from the group consisting of a discrete logic output, and a signal communicated over a communication media, a Controller Area Network (CAN) bus signal, a device message, and a switch contact operation command. For example, the communication media can be selected from the group consisting of a radio frequency link, a wired link, a serial bus link, and an optical link.

These and other advantages and features will become more apparent from the following description taken in conjunction with the drawings.

BRIEF DESCRIPTION OF THE DRAWINGS

The specifics of exclusive rights described herein are particularly pointed out and distinctly claimed in the claims at the conclusion of the specification. The foregoing and other features, and advantages of the technical solutions described herein are apparent from the following detailed description taken in conjunction with the accompanying drawings in which:

DETAILED DESCRIPTION

As used herein the terms module and sub-module refer to one or more processing circuits such as an application specific integrated circuit (ASIC), an electronic circuit, a processor (shared, dedicated, or group) and memory that executes one or more software or firmware programs, a combinational logic circuit, and/or other suitable components that provide the described functionality. As can be appreciated, the sub-modules described below can be combined and/or further partitioned.

As mentioned above, issues such as mechanical and electrical stack compromises can arise when mechanical features and electrical output signals defined for a switch are not synchronized and overlap (e.g., when the intended mechanical feature cannot be resolved during switch operation and an incorrect electrical response is generated). For example, in the case of ignition switches, the electrical contact functions must be reliably synchronized with mechanical features such as detents, spring-returned (momentary) functions, and interlocks to minimize undesirable overlap. Illustrative embodiments for a non-contact programmable switch and method of using same to emulate a target switch as an improved high-reliability switch are described herein to overcome disadvantages of conventional switches that are subject to mechanical tolerances that can create varying operational timing and undesirable mechanical and electrical stack compromises.

Figure 1:
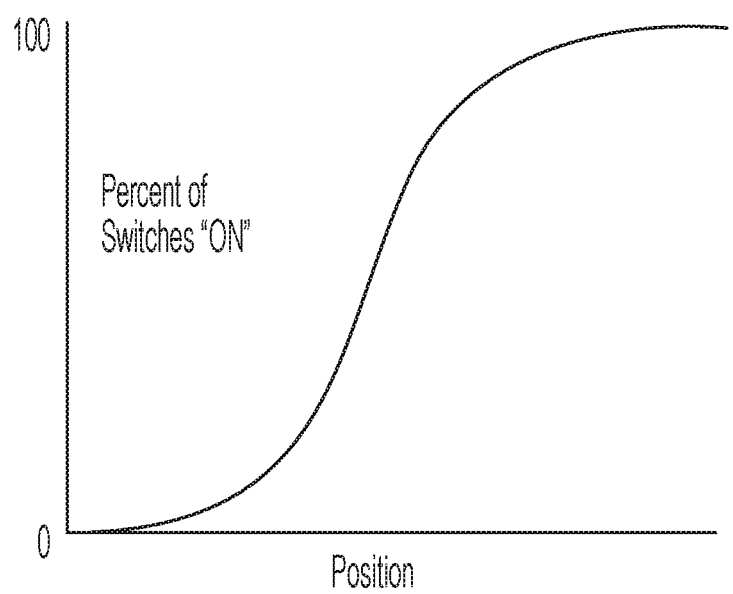
FIG. 1 is a diagram depicting a curve representing the probability of a switch being asserted during its mechanical travel relative to a population of all switches.
Figure 2:
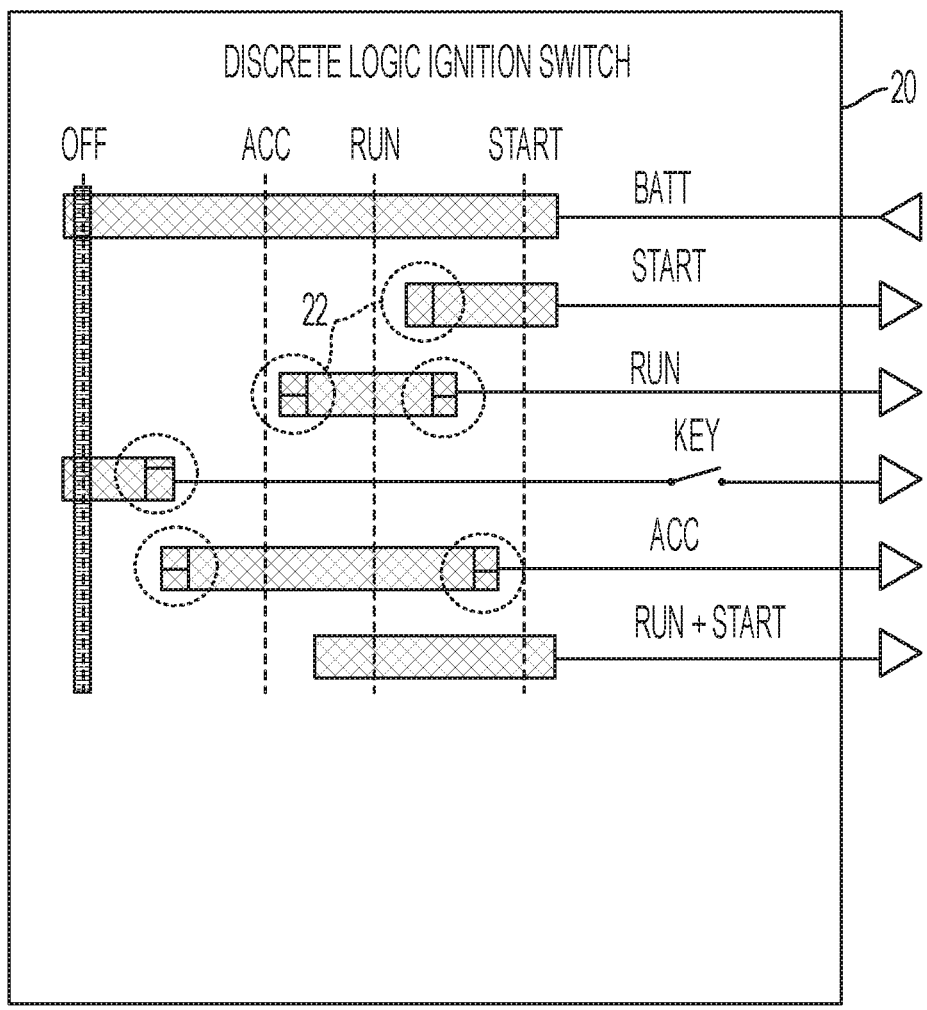
FIG. 2 is a diagram of an example conventional switch.
Figure 5:
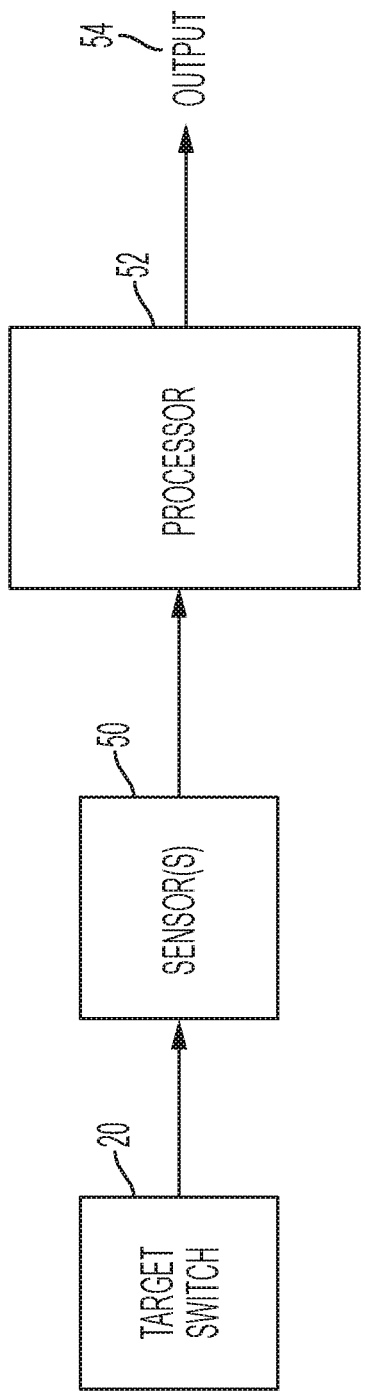
FIG. 5 is a block diagram of an example programmable non-contact switch configured to emulate a target switch in accordance with one or more illustrated embodiments.

FIG. 2 is a diagram of an example target switch (e.g., target switch 20 in FIG. 5 described below) for which illustrative embodiments can be used to emulate a high-reliability switch. The switch in FIG. 2 is a discrete logic ignition switch having OFF, accessory (ACC), RUN and START functions or operations that correspond to switch features such as corresponding detents or interlocks and/or spring-returned (momentary) start and end of travel positions. It is to be understood that the target switch 20 can be any type of switch in any application wherein highly reliable switch operation is desirable such as in safety critical automotive applications (e.g., a turn signal switch, a windshield wiper operation switch, an air bag deployment operation switch, headlamp switches, and an automotive transmission control switch (i.e., a shifter or gear shift), and the like), or a human machine interface operation switch (e.g., in a robotics application), and so on.

Figure 3:
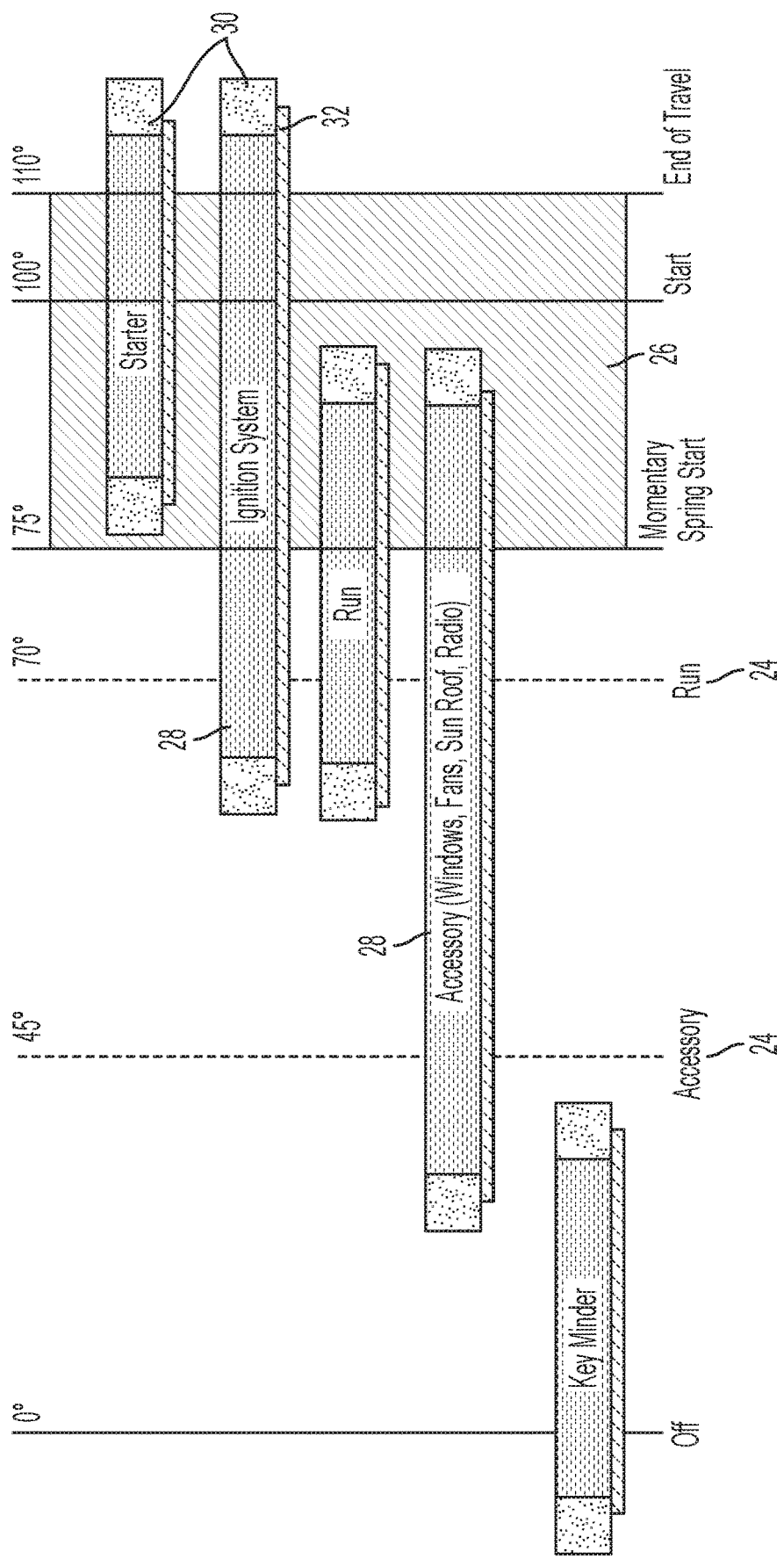
FIG. 3 is an example switch operation profile diagram.

FIG. 3 is a conventional switch operation profile diagram for an ignition switch that represents example switch functions or operations (e.g., OFF, ACC, RUN and START) with respect to example switch features. A dashed line 24 indicates a mechanically detented position. The cross-hatched area 26 indicates momentary (spring return) start and end of travel positions. Areas 28 indicated "must make" zones. Areas 30 indicate "may make" tolerance zones (up to 6°). Areas or bars 32 indicate operation of a typical target switch (e.g., target switch 20 in FIG. 5).

Figure 4:
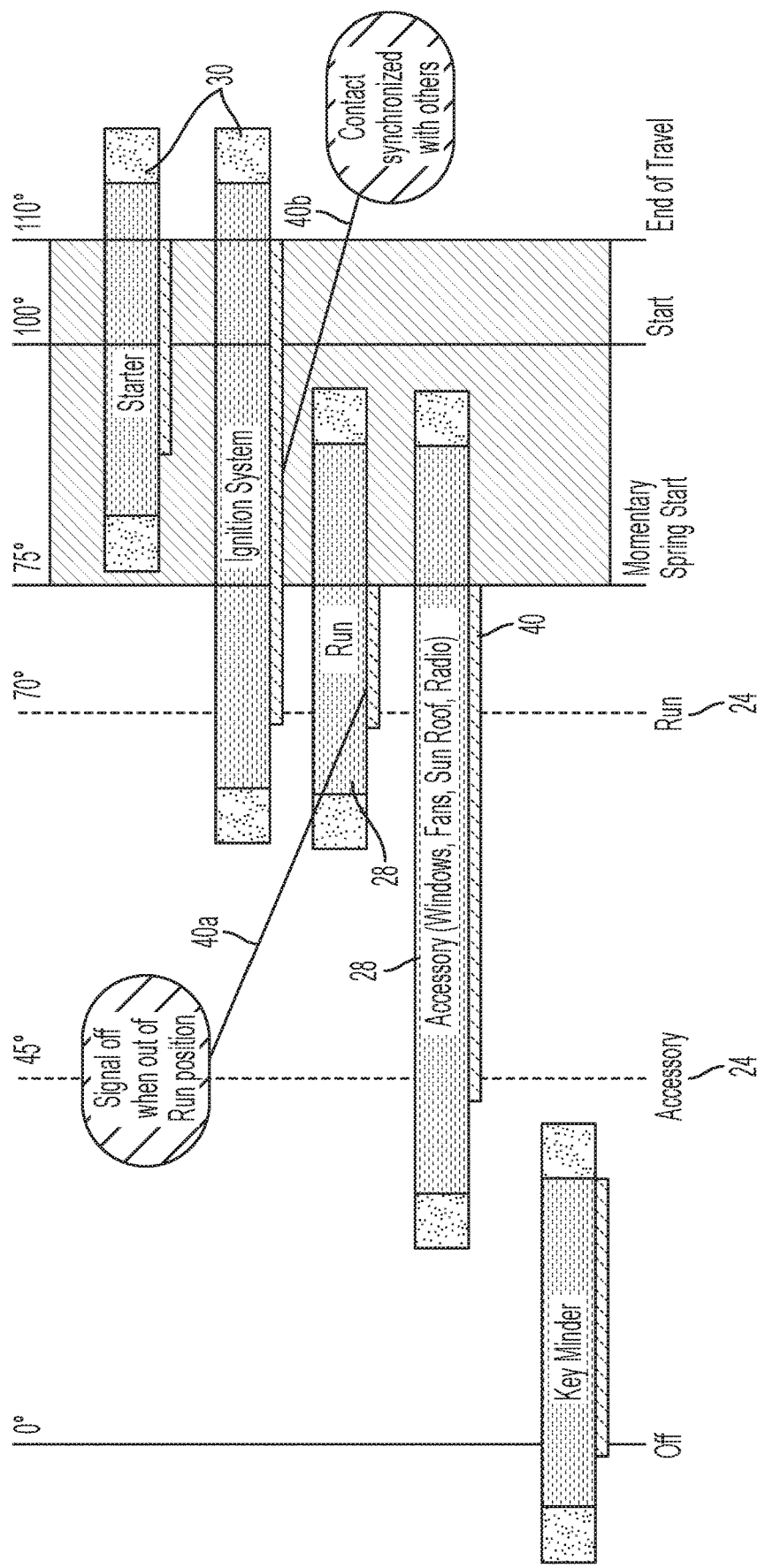
FIG. 4 is an example improved switch operation profile diagram using a method of emulating a high-reliability switch in accordance with one or more illustrated embodiments.

As will be described below, when this target ignition switch is emulated using a programmable non-contact switch in accordance with illustrative embodiments, an improved switch operation profile diagram for the ignition switch is achieved as illustrated in FIG. 4. When the switch operation profile diagrams of FIGS. 3 and 4 are compared, it can be seen that using the programmable non-contact switch in accordance with illustrative embodiments to emulate the target ignition switch achieves a learned switch profile in FIG. 4 that does not have the large tolerances of the traditional target ignition switch described with reference to FIGS. 2 and 3. Compare, for example, the bars 28 in FIG. 3 with bars 40 in FIG. 4. The bars 28 illustrate significant overlap of electrical functions with respect to mechanical features. By contrast, the bars 40 in the learned switch profile in FIG. 4, and particularly bars 40a and 40b, illustrate how contact timing is synchronized and detents are used to learn the mechanical travels between positions such that tolerances no longer provide unwanted functions in incorrect positions due to stack-up of mechanical and electrical parts.

As illustrated in FIG. 4 and described further below with reference to FIGS. 5-9, the technical solution provided by the illustrative embodiments comprises a programmable non-contact switch that utilizes non-contact position sensors 50 and a processor 52 with a switching algorithm in a novel and advantageous manner to improve the function of traditional switches 20. The sensor technology used is similar to position sensors in electric power steering (EPS) systems; however, the sensor technology is optimized by the illustrative embodiments for switch emulation whereby the sensor output 54 is learned and reliably used for a designated switch function or operation. The output 54 can be used to designate a switch operation (e.g., RUN or ACC), trigger a software update, or send a message in a system in which the switch operates (e.g., via a CAN bus).

The programmable non-contact switch comprising the non-contact position sensor(s) 50 and processor 52 can be rotary or linear in the action. The sensor(s) 50 can be, for example, a non-contact solid state sensor which does not have an electrical cycle limit, which makes the electrical working of the programmable non-contact switch very robust over its life.

Figure 6:
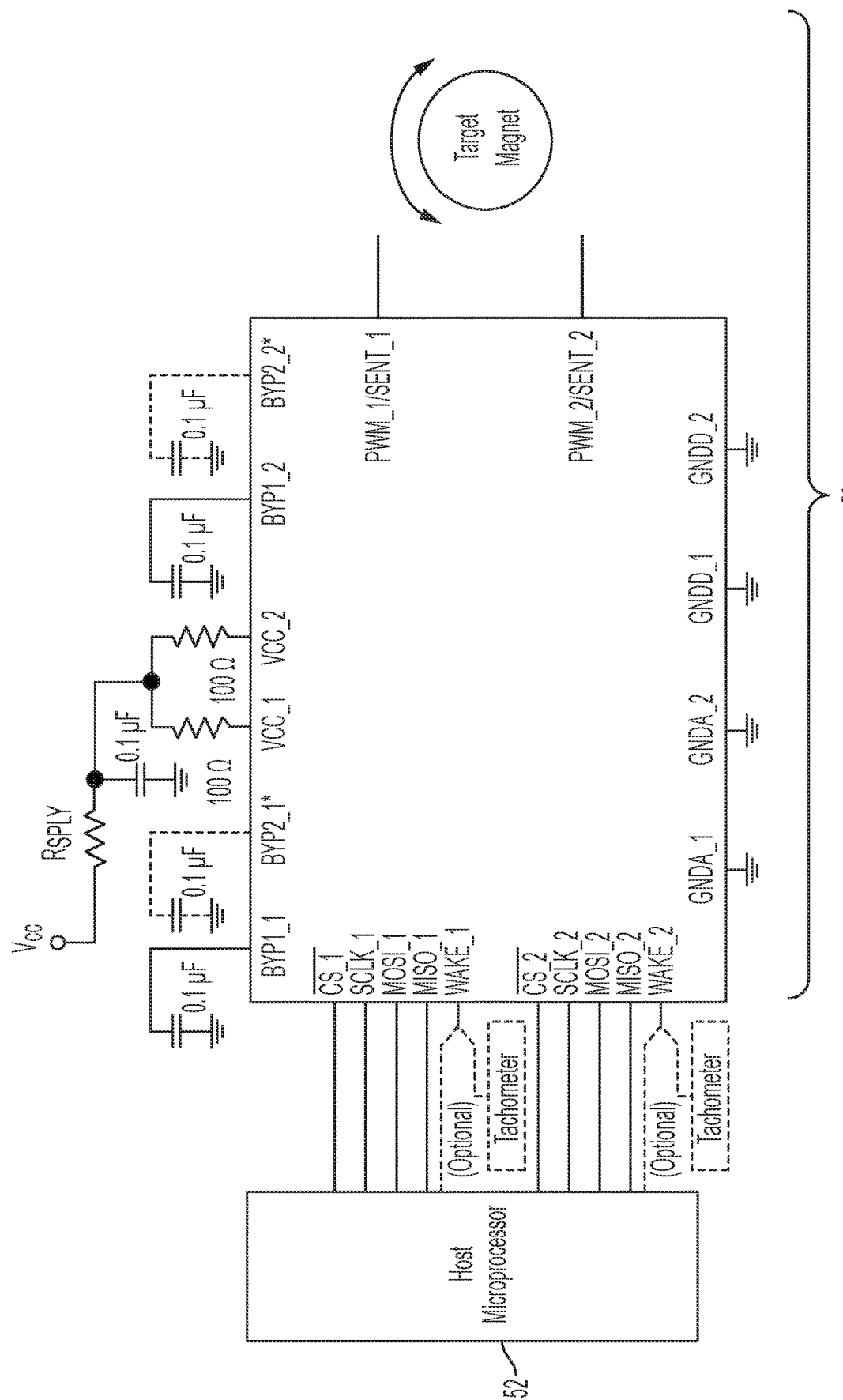
FIG. 6 is a diagram of an example programmable non-contact switch in accordance with one or more illustrated embodiments.
Figure 7:
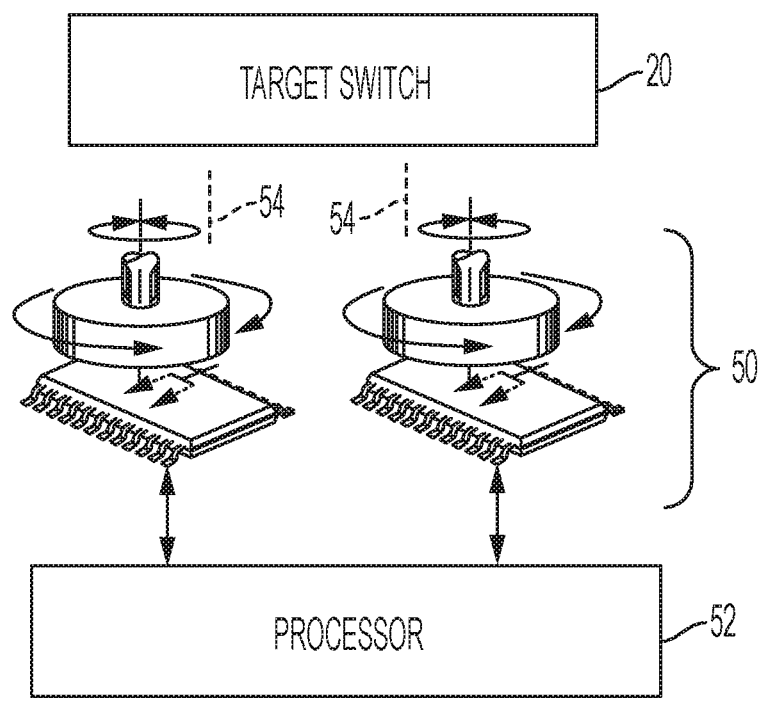
FIG. 7 is a block diagram of an example programmable non-contact switch employing two angle position on-axis Hall sensors and configured to emulate a target switch in accordance with one or more illustrated embodiments.

In accordance with an example embodiment, the sensor(s) 50 comprise two angle position on-axis Hall sensors. These sensors detect the rotation of a pair of two pole magnets, as illustrated in FIGS. 6 and 7. The magnets are rotated in unison by a common driver, but at differing rates of rotation. This rate variation is accomplished by using two differing gear ratios. As a further enhancement, the Hall sensors may be dual, that is, using two Hall elements in a parallel configuration for redundancy to improve robustness. This redundant configuration allows these sensors 50 to meet ASIL "D" requirements in systems compliant with the functional safety per the International Organization for Standardization (ISO) 26262 standard for functional safety of electrical and/or electronic systems in production automobiles.

With continued reference to FIGS. 6 and 7, the sensor(s) 52 and processor 50 can be, for example, a Hall-effect angle sensor integrated circuit (IC) (e.g., model A3337) available from Allegro Microsystems, LLC, Manchester, N.H. It is to be understood, however, that a different IC can be used, and that the sensor(s) 50 and processor 52 need not be provided in the same component or package. As an example, the A1337 has a system-on-chip (SoC) architecture with controller, memory, digital signal processing, analog frontend, analog-to-digital conversion, and sensing technology that provides contactless high-resolution position information based on magnetic circular vertical Hall (CVH) technology. The A1337 incorporates two electrically independent Hall-based sensor dies in the same surface-mounted package. Each Hall-sensor based die measures the direction of the magnetic field vector through 360° in an x-y plane and computes an angle measurement based on the actual physical reading, as well as any internal configuration parameters that have been set by a system designer. The output of each die is used by the host microcontroller 52 to provide a single channel of target data. Example components for the programmable non-contact switch of the illustrative embodiments that are used for an ISO26262 ASIL D (safety critical) application can be dual independent SOIC components like the A1335, A1337, and A1338 available from Allegro Microsystems, LLC, although other components and manufacturers can be used.

With continued reference to FIGS. 6 and 7, the rotation of each magnet can be sensed to 0.02° giving very high precision. The varying rates of rotation yield a changing sinusoidal phase difference between the two magnets. This allows for unique positions to be sensed over multiple magnet rotations. This multiple rotation capability allows small angular rotations to be amplified mechanically without being restricted to 360° of magnet rotation. This position information can then be stored into a microcontroller 52 and associated with switch functions or outputs 54 using a switching algorithm (FIG. 9) implemented by the microcontroller 52 in accordance with illustrative embodiments. These switch functions 54 can be, for example, solid state electrical outputs (discrete outputs), or signals (e.g., messages) for transmission over a communication media (radio, serial bus, optical link, etc.). This allows the programmable non-contact switch of illustrative embodiments to be programmed by moving the switch or target device 20 to a mechanical feature (detent, interlock limit, or other position) and learning the position corresponding to that feature. Electrical function associated with that position can then be output 54 when that position is sensed in accordance with the switching algorithm in the processor 52. Target switch 20 functions can be learned over a range of mechanical travel, allowing the switching algorithm of illustrative embodiments to emulate a conventional mechanical switch without the mechanical switch limitations.

Figure 8:
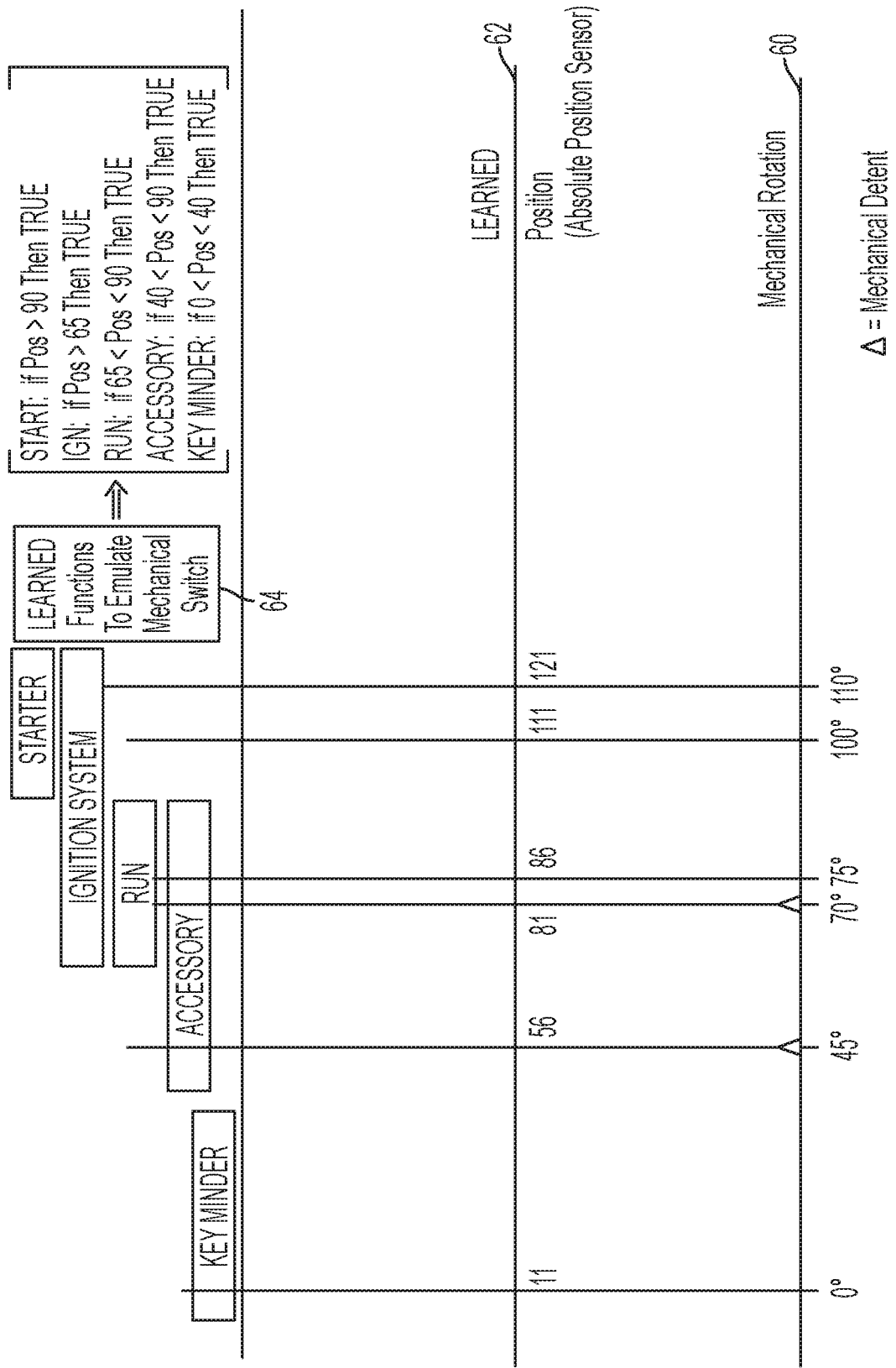
FIG. 8 is improved switch operation profile diagram indicating representative learned functions that emulate an example target mechanical switch in accordance with one or more illustrated embodiments.

In accordance with example embodiments, the programmable non-contact switch comprising the non-contact position sensor(s) 50 and processor 52 with switching algorithm provides a learning procedure that is particularly useful in removing variation resulting from component tolerances. The make points, break points, and all operating zones for a target device 20 are able to be customized to each assembly and its unique physical qualities. For example, an improved switch operation profile diagram indicating representative learned functions that emulate an example target mechanical switch in accordance with one or more illustrated embodiments is depicted in FIG. 8. Mechanical switch degrees of rotation and detents are indicated along line 60. The learned positions generated using the switch algorithm of the illustrative embodiments are indicated along line 62. As indicated at 64, the learned functions to emulate the mechanical switch 20 do not have the large tolerances of a traditional target ignition switch such as that described with reference to FIGS. 2 and 3 and obviate varying operational timing and undesirable mechanical and electrical stack compromises. For example, the following outputs 54 are generated based on the sensed positions identified below:

STARTER: If position is >90° then true.
IGNITION SYSTEM: If position is >65° then true.
RUN: If 65°<position<90° then true.
ACCESSORY: If 40°<position<90° then true.
KEY MINDER: If 0°<position<40° then true.

When comparing a conventional switch profile in FIG. 2 with an improved switch profile in FIG. 4 or 8, it is evident that there is more precision with respect to the learned functions and the sensed positions in FIG. 4 or 8. For example, there is no overlap between the STARTER function, and the RUN and ACCESSORY functions, and therefore less possibility for mechanical and electrical stack compromises.

It is to be understood that other non-contact technologies can be used to sense the rotation of the two gears described above in connection with FIG. 7 such as magneto reluctance or capacitive sensors, for example. The on-axis Hall sensor has very good reliability and sensitivity. Additionally, the on-axis Hall sensor allows for error correction due to mechanical tolerances using a trimming process.

Figure 9:
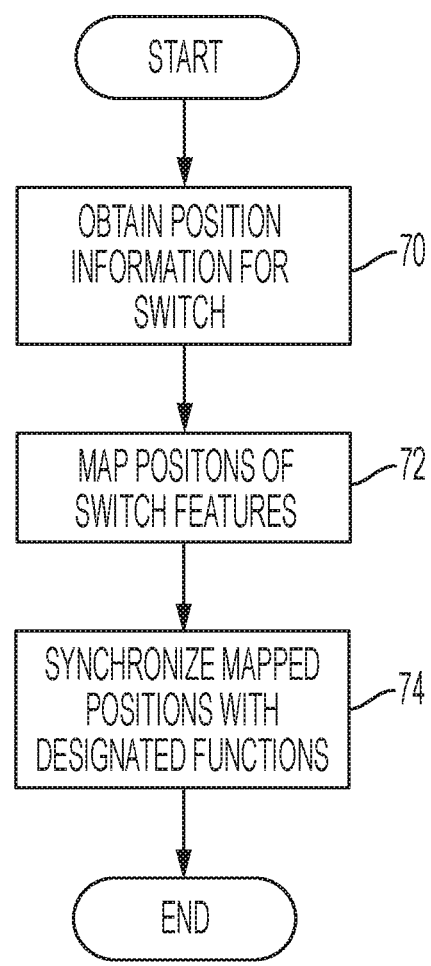
FIG. 9 is a block diagram of steps in an example method of emulating a high-reliability switch.

Reference is now made to FIG. 9 which is a flow chart illustrating an example method that can be implemented as a sequence of operations via the processor 52 in accordance with the switching algorithm. The example of the illustrative embodiments comprises three steps: a) obtaining position information from a high-reliability sensor as indicated at 70; b) mapping positions of features (detents, spring-return element as needed) as indicated at 72; and c) assigning functions based on the position information. Each of these steps in the method is discussed in further detail below.

For example, with regard to obtaining position information (block 70), the position information can be obtained with either a rotary action sensor 50 or a linear action sensor 50. As described above, a non-contact solid-state sensor that does not have an electrical cycle limit is advantageous. For example, using a non-contact solid-state sensor ensure that the electrical operations of the switch are very robust over the lifetime of the switch.

As described above, an advantageous embodiment uses two (2) angle position, on-axis, Hall sensors 50. These sensors 50 detect the rotation of a pair of two-pole magnets as shown in FIG. 7. The magnets are rotated in unison by a common driver, but at differing rates of rotation. This rate variation is accomplished by using two differing gear ratios. The rotation of each magnet can be sensed to 0.02° giving very high precision. The varying rates of rotation yield a changing sinusoidal phase difference between the two magnets. This allows for unique positions to be sensed over multiple magnet rotations. This multiple rotation capability allows small angular rotations to be amplified mechanically without being restricted to 360° of magnet rotation. As a further enhancement, each of the Hall sensors may use two Hall elements in a parallel configuration to improve the robustness through redundancy. In this configuration, the sensor system can meet ASIL "D" requirements in systems compliant with the functional safety per ISO 26262.

With regard to block 72 in FIG. 9 and the operation of mapping the positions of features on a target switch 20 being emulated by the technical solution of the illustrative embodiments, position information generated with the sensor(s) 50 can then be stored via the processor 52 and important positions in the travel learned. These positions may be detent positions, ends of travel, beginning of a spring-return (momentary) zone, or other important positions (interlock engagement). During a calibration procedure, these positions are learned by moving the sensor 52 to a mechanical feature and saving the position information. This learning procedure is particularly useful in removing variation resulting from component tolerances. Hence, the positions can be "customized" to each assembly and its unique physical qualities.

With regard to block 74 in FIG. 9 and the operation of assignment of functions, the position mapping from the proceeding operation (block 72) is synchronized with predefined functions 54. These functions can be module outputs (discrete), logical states, analog outputs, or even messages communicated over a network. The network can be a serial bus (ie CAN, Lin, Flexray, etc), optical link, or radio frequency transmission (wifi, Bluetooth, etc). For example, a designated switch map position can be configured via the switching algorithm to cause output of a CAN message versus a close contact. Thus, during operation, read position and output of a switch can be functions beyond mere contact closure.

Functions can be learned over a range of mechanical travel, allowing the switching algorithm to simulate a conventional mechanical switch without the mechanical switch limitations. The technical solution provided by the illustrative embodiments creates a learned and mapped device such that essentially every switch can be uniquely programmed and configured for the mechanical system in which it operates. The technical solution provided by the illustrative embodiments is advantageous because the position of the switch generally known at all times such that a system designer can learn where a system actually is versus where it is planned to be. The system designer can use absolute position technology and map essentially any function or message to a reliably sensed position in accordance with the illustrative embodiments.

Technical solutions are described herein in accordance with one or more illustrative embodiments that utilize a robust non-contact position sensor in a novel way to emulate the function of traditional switches. No application of Hall sensors to emulate traditional switches is known to exist. The sensor technology used is similar to the position sensors in Electric Power Steering Systems; however, it is optimized for switch emulation, which is a unique function, and the output is used for switch emulation.

While the technical solutions has been described in detail in connection with only a limited number of embodiments, it should be readily understood that the technical solutions are not limited to such disclosed embodiments. Rather, the technical solutions can be modified to incorporate any number of variations, alterations, substitutions or equivalent arrangements not heretofore described, but which are commensurate with the spirit and scope of the technical solutions. Additionally, while various embodiments of the technical solutions have been described, it is to be understood that aspects of the technical solutions may include only some of the described embodiments. Accordingly, the technical solutions are not to be seen as limited by the foregoing description.

The invention claimed is:

1. A high reliability switch, comprising
   a sensor configured to sense position information for one or more features of the switch along a range of mechanical travel associated with operating the switch; and
   a controller configured to store in a memory device the position information and a corresponding output for each of the one or more features, and to generate the corresponding output when the sensor detects the position information for that output during operation of the switch;

wherein the position information is generated by the sensor during a learning operation during which the switch is moved to each feature among the one or more features along the range of mechanical travel, and the sensor generates position information for that feature, and the position information is stored by the controller with a corresponding output designated for that feature; and wherein the switch is operated using the corresponding output designated for each of the features.

2. The high reliability switch of claim 1, wherein the switch has at least one action chosen from a rotary action and a linear action, and the range of mechanical travel is about an axis of rotation for the rotary action and along a longitudinal axis for the linear action.

3. The high reliability switch of claim 1, wherein the one or more features of the switch are chosen from a detent position, an interlock engagement position, a position corresponding to a beginning of a momentary switch operation zone, and an end of travel position.

4. The high reliability switch of claim 1, wherein the sensor is a non-contact solid state sensor.

5. The high reliability switch of claim 1, wherein the sensor is selected from the group consisting of a Hall effect sensor, a magneto reluctance sensor, and capacitance sensor.

6. The high reliability switch of claim 1, wherein the sensor comprises two angle position on-axis Hall effect elements configured to detect the rotation of a pair of two pole magnets rotated in unison but at differing rates of rotation to generate sinusoidal phase difference between the two magnets to sense the position information of the switch.

7. The high reliability switch of claim 1, further comprising a second sensor to sense the position information for the one or more features of the switch to provide redundant position information to the controller.

8. The high reliability switch of claim 1, wherein the switch is selected from the group consisting of an automotive ignition switch, an automotive windshield wiper switch, an automotive turn signal switch, an automotive headlamp switch, an automotive transmission control switch, and an air bag deployment operation switch.

9. The high reliability switch of claim 1, wherein the output is selected from the group consisting of a discrete logic output, a signal communicated over a communication media, a Controller Area Network (CAN) bus signal, a device message, and a switch contact operation command.

10. The high reliability switch of claim 9, wherein the communication media is selected from the group consisting of a radio frequency link, a wired link, a serial bus link, and an optical link.

11. A method of operating a high reliability switch comprising:

deploying a sensing device with respect to a switch to generate position information related to the switch, the sensing device being configured to sense position information for one or more features of the switch along a range of mechanical travel associated with operating the switch;

mapping the position information corresponding to the one or more features of the switch to generate a learned profile of the switch;

defining an output for respective ones of the one or more features of the switch and storing the output and the corresponding position information for the respective ones of the one or more features of the switch; and operating the switch using the defined output for the respective ones of the one or more features of the switch.

12. The method of claim 11, further comprising defining a range of position information values with respect to the corresponding position information for the respective ones of the one or more features of the switch.

13. The method of claim 12, further comprising operating the switch and, when position information is sensed that is in the range of position values defined for a respective one of the one or more features of the switch, generating the stored output that corresponds to the sensed position information during operation of the switch.

14. The method of claim 11, wherein the mapping comprises obtaining position information for one or more features of the switch chosen from a detent position, an interlock engagement position, a position corresponding to a beginning of a momentary switch operation zone, and an end of travel position.

15. The method of claim 11, wherein deploying the sensing device comprises using a non-contact solid state sensor to sense the switch, the non-contact solid state sensor selected from the group consisting of a Hall effect sensor, a magneto reluctance sensor, and capacitance sensor.

16. The method of claim 15, wherein the sensing device is a Hall effect sensor comprising two angle position on-axis Hall effect elements configured to detect the rotation of a pair of two pole magnets rotated in unison but at differing rates of rotation to generate sinusoidal phase difference between the two magnets to sense the position information of the switch.

17. The method of claim 11, wherein the switch is selected from the group consisting of an automotive ignition switch, an automotive windshield wiper switch, an automotive turn signal switch, an automotive headlamp switch, an automotive transmission control switch, and an air bag deployment operation switch.

18. The method of claim 11, wherein defining the output comprises designating an output with respect to position information that is selected from the group consisting of a discrete logic output, a signal communicated over a communication media, a Controller Area Network (CAN) bus signal, a device message, and a switch contact operation command.

19. The method of claim 18, wherein the communication media is selected from the group consisting of a radio frequency link, a wired link, a serial bus link, and an optical link.

* * * * *